(12) United States Patent
Kreit et al.

(10) Patent No.: US 8,847,892 B2
(45) Date of Patent: Sep. 30, 2014

(54) PRESSURE SENSITIVE INDUCTIVE DETECTOR FOR USE IN USER INTERFACES

(76) Inventors: Darran Kreit, Cambridge (GB); Mark Anthony Howard, Suffolk (GB)

( * ) Notice: Subject to any disclaimer, the term of this patent is extended or adjusted under 35 U.S.C. 154(b) by 392 days.

(21) Appl. No.: 12/093,251

(22) PCT Filed: Jun. 22, 2007

(86) PCT No.: PCT/GB2007/002339
§ 371 (c)(1),
(2), (4) Date: Sep. 23, 2008

(87) PCT Pub. No.: WO2008/012491
PCT Pub. Date: Jan. 31, 2008

(65) Prior Publication Data
US 2009/0160789 A1 Jun. 25, 2009

(30) Foreign Application Priority Data

| Jul. 22, 2006 | (GB) | 0614631.0 |
| Sep. 12, 2006 | (GB) | 0617884.2 |
| Dec. 6, 2006 | (GB) | 0624366.1 |
| Jan. 16, 2007 | (GB) | 0700789.1 |
| Feb. 1, 2007 | (GB) | 0701868.2 |
| Feb. 6, 2007 | (GB) | 0702208.0 |
| Feb. 17, 2007 | (GB) | 0703149.5 |
| Feb. 22, 2007 | (GB) | 0703441.6 |
| Mar. 2, 2007 | (GB) | 0704166.8 |
| Mar. 7, 2007 | (GB) | 0704349.0 |
| Apr. 17, 2007 | (GB) | 0707460.2 |

(51) Int. Cl.
*G06F 3/041* (2006.01)
*H03K 17/97* (2006.01)
*G06F 3/046* (2006.01)

(52) U.S. Cl.
CPC ...... *G06F 3/046* (2013.01); *H03K 2217/96038* (2013.01); *H03K 17/97* (2013.01)
USPC .................................................. 345/173

(58) Field of Classification Search
CPC ....................................................... G06F 3/041
See application file for complete search history.

(56) References Cited

U.S. PATENT DOCUMENTS

| 5,546,806 | A | 8/1996 | Kain | |
| 7,296,485 | B2 | 11/2007 | Kain | |
| 2004/0246238 | A1* | 12/2004 | Oya et al. | 345/173 |
| 2006/0012576 | A1* | 1/2006 | Hafez et al. | 345/173 |
| 2006/0103632 | A1* | 5/2006 | Bourdelais et al. | 345/173 |

FOREIGN PATENT DOCUMENTS

| DE | 197 14 195 | | 10/1998 |
| DE | 102 42 385 | A1 | 4/2004 |
| EP | 1 357 370 | A1 | 10/2003 |

(Continued)

OTHER PUBLICATIONS

Search Report for corresponding application No. PCT/GB2007/002339 file Jun. 22, 2007.

*Primary Examiner* — Tony N Ngo
(74) *Attorney, Agent, or Firm* — Renner, Otto, Boisselle & Sklar, LLP

(57) ABSTRACT

An apparatus for user interfaces is described to measure inductively the deformation of a body (1) comprising at least two laminar conductive elements (3, 4), at least one of which is an AC energized inductor (4), wherein deformation causes relative axial movement between the at least two laminar elements (3, 4) and the maximum deformation distance is limited to prevent damage.

15 Claims, 9 Drawing Sheets

(56) References Cited

FOREIGN PATENT DOCUMENTS

| JP | 2005-004274 | 1/2005 |
| WO | 2004/061759 | 7/2004 |
| WO | WO 2004061759 A2 * | 7/2004 | ............ G06K 11/00 |
| WO | 2005/081907 A2 | 9/2005 |
| WO | 2006/064234 | 6/2006 |
| WO | 2006/064245 | 6/2006 |

* cited by examiner

PRESSURE SENSITIVE INDUCTIVE DETECTOR FOR USE IN USER INTERFACES

FIELD OF THE INVENTION

This invention relates to a pressure sensitive detector and, in particular to such a detector for use in user interfaces.

REVIEW OF THE ART KNOWN TO THE APPLICANT

Push buttons typically detect a user's input by making or breaking electrical contacts. Such buttons are unreliable in harsh environments where foreign matter, fluid or impact can cause electrical contacts to fail. Protective gaiters or seals are notoriously unreliable.

Various alternatives to push buttons are known, including capacitive, infrared and piezo sensors. All are problematic. Capacitive detectors suffer from temperature or humidity drift and are often unable to differentiate between a user's finger and a water droplet, for example. Infra-red touch sensors are expensive and need a transparent panel such as glass between the sensor and the user. Piezo sensors need expensive materials and precision assembly.

Inductive displacement detectors, such as that described by the present inventors in WO 2006/064234, have also been used but typically these require a relatively large displacement for effective touch sensing.

WO 2004/061759 describes an apparatus to detect the position of deformation along an axis transverse to the axis of deformation. The construction is complex and is therefore relatively expensive to manufacture.

SUMMARY OF THE INVENTION

The present invention provides a pressure sensitive detector for a user interface comprising a first generally laminar inductive component, a second generally laminar inductive component and a resilient panel. The first inductive component and the second inductive component are arranged in facing relation and are mutually spaced. The resilient panel is arranged for flexural movement relative to the second inductive component and the first inductive component is arranged for movement with the resilient panel, whereby, in use, pressure applied to the resilient panel causes movement of the first inductive component relative to the second inductive component, and a consequent change in the inductive coupling between the first and second inductive components. The resilient panel has a stiffness of at least 500 N/m and the ratio of the mutually overlapping area of the first and second inductive components to the square of the spacing of the first and second inductive components is greater than 150 to 1.

According to the invention, a pressure sensitive detector is provided that has an elastically deformable resilient panel that is relatively stiff. Thus, the resilient panel is sufficiently robust that it can form an outer, environmentally-exposed surface of the detector, such as the keypad of a touch-sensitive input device. However, because the resilient panel is relatively stiff, there is relatively little movement of the panel in response to, for example, a user's touch, and this makes the panel difficult to use as a touch-sensitive keypad. The invention solves this problem by providing first and second inductive components that have a very large overlapping area relative to their mutual spacing. In this way, even very small movements of the resilient panel can be detected. The combination of the stiff panel and the large ratio of area to spacing of the inductive components provides a very effective pressure-sensitive detector, of particular use as a user-input device.

This invention, at least in its preferred embodiments, provides a simple, robust and inexpensive apparatus to detect deformation of the resilient panel. The invention is particularly useful for user interfaces which often need robust panels for reliable operation in harsh environments, easy cleaning or good aesthetics, but also sensitive detection of user input.

The first and second inductive components may be any suitable inductive components that are capable of detecting movement of the resilient panel. Thus, one of the first and second inductive components may be a transmit antenna and the other may be a receive antenna, with the amplitude of an AC signal received by the receive antenna being indicative of the relative spacing of the antennae. The first and second inductive components may take the form of one or more transmit and receive antennae.

In a presently preferred arrangement, one of the first and second inductive components is a bulk conductor. In this arrangement, the other of the inductive components is an inductor coil. Thus, the proximity of the bulk conductor to the inductor coil changes the inductance of the inductor coil, whereby to indicate the mutual spacing of the bulk conductor and inductor coil. With this arrangement, a change in inductance is indicative of movement of the resilient panel and this can easily be incorporated in a suitable electronic detection circuit. A material of high magnetic permeability may be used as an alternative to a bulk conductor.

This in itself is believed to be a novel construction and thus, viewed from a further aspect the invention provides a pressure sensitive detector for a user interface comprising a first generally laminar inductive component, a second generally laminar inductive component and a resilient panel, wherein the first inductive component and the second inductive component are arranged in facing relation and are mutually spaced, the resilient panel is arranged for flexural movement relative to the second inductive component and the first inductive component is arranged for movement with the resilient panel, whereby, in use, pressure applied to the resilient panel causes movement of the first inductive component relative to the second inductive component, and a consequent change in the inductance of the first and second inductive components, and wherein one of the first and second inductive components is a bulk conductor or a material of high magnetic permeability and the other of the inductive components is an inductor coil.

In this aspect, the ratio of the mutually overlapping area of the first and second inductive components to the square of the spacing of the first and second inductive components may be greater than 150 to 1. Similarly, the resilient panel may have a stiffness of at least 500 N/m The first inductive component may be a bulk conductor. The second inductive component may be an inductor coil. In this arrangement, the first inductive component, which is typically nearest to the exterior of the detector, is a passive component that does not require an electrical power connection. This simplifies the construction of the detector.

The bulk conductor is typically composed of metal, for example copper or silver. Thus the bulk conductor may be a conductive layer, for example a metal sheet or layer. If desired, the first inductive component may be formed by the resilient panel, which also simplifies the construction of the detector. Alternatively, the first inductive component may be mounted to the resilient panel. For example, the first inductive component may be formed as a layer on the resilient panel. The first inductive component may be mounted directly or indirectly on the resilient panel. For example an intervening layer, such as an insulating layer, or member may be provided between the resilient panel and the first inductive component.

The second inductive component may be formed as a layer deposited, for example printed, on a substrate, such as a printed circuit board. The resilient panel may be mounted (directly or indirectly) to the substrate. Indeed, the detector may be constructed as a series of layers forming the substrate, second inductive component, first inductive component and/or the resilient panel. This provides a particularly advantageous construction method, because of the relative simplicity of manufacturing.

Typically, the layers of the detector, such as the resilient panel, the first and second inductive components and/or the substrate are flat (or planar). However, it is feasible that these layers may not be flat and may take, for example, an undulating or arcuate form.

A spacer layer may be provided between the first and second inductive components. For example, the space layer may be formed of a material having a lower Young's modulus than the resilient layer. In this case, the spacer layer can act to provide additional resilience to the outer surface of the detector. The spacer layer may act to insulate electrically the first inductive component from the second inductive component to prevent short circuits.

In one arrangement, the spacer layer has apertures formed therethrough which define a sensitive region of the detector. Thus, in the region of the apertures, the resilient layer is unsupported by the space layer and can deform elastically. Outside of the apertures, the spacer layer supports the resilient layer and prevents deformation. Thus, the spacer layer acts to isolate mechanically the sensitive region(s) of the detector. In a convenient construction, the spacer layer may be formed of a rigid material, such as printed circuit board substrate material.

The stiffness of the resilient layer is typically greater than 3,000 N/m and may be greater than 5,000 N/m. In embodiments of the invention, the stiffness of the resilient layer is greater than 30,000 N/m, particularly greater than 50,000 N/m, more particularly greater than 300,000 N/m, even more particularly greater than 500,000 N/m.

The stiffness of the resilient layer is defined as the ratio of the force applied to the resilient layer at a given point to the deflection of the resilient layer at that point in response to the force. For the purposes of this application, the stiffness may be determined at the point of maximum deflection of the resilient layer in the region of sensitivity of the detector.

In order to provide the requisite stiffness, the Young's modulus of the resilient layer is typically greater than 2 GPa and may be greater than 5 GPa. In embodiments of the invention, the Young's modulus of the resilient layer is greater than 10 GPa, particularly greater than 20 GPa, more particularly greater than 40 GPa, even more particularly greater than 80 GPa and may be greater than 160 GPa. Similarly, the Young's modulus of the resilient layer is generally less than 500 GPa, particularly less than 300 GPa. Suitable materials for the resilient layer include stainless steel and aluminium.

In particular embodiments, the ratio of the mutually overlapping area of the first and second inductive components to the square of the spacing of the first and second inductive components may be greater than 300 to 1, particularly greater than 1,000 to 1, and even greater than 3,000 to 1. Where either inductive component is formed as a spiral, coil or similar structure, the area occupied by the inductive component is considered as the area defined by the outermost extent of the component, rather than the surface area of component per se.

Viewed from a broad aspect, the invention provides an apparatus to measure deformation comprising at least two laminar elements separated by a relatively small distance. At least one of the laminar elements is an inductive winding and deformation causes relative movement between at least parts of the two laminar elements.

The invention extends to a touch sensitive user input device comprising a detector according to the invention. The input device may comprise a plurality of detectors. The detectors may have a common resilient panel. The input device may comprise a display device mounted to a surface of the resilient panel remote from the second inductive component.

BRIEF DESCRIPTION OF THE DRAWINGS

Embodiments of the invention will now be described, by way of example only, and with reference to the accompanying drawings, in which.

DESCRIPTION OF EXEMPLARY EMBODIMENTS

Figure 1:
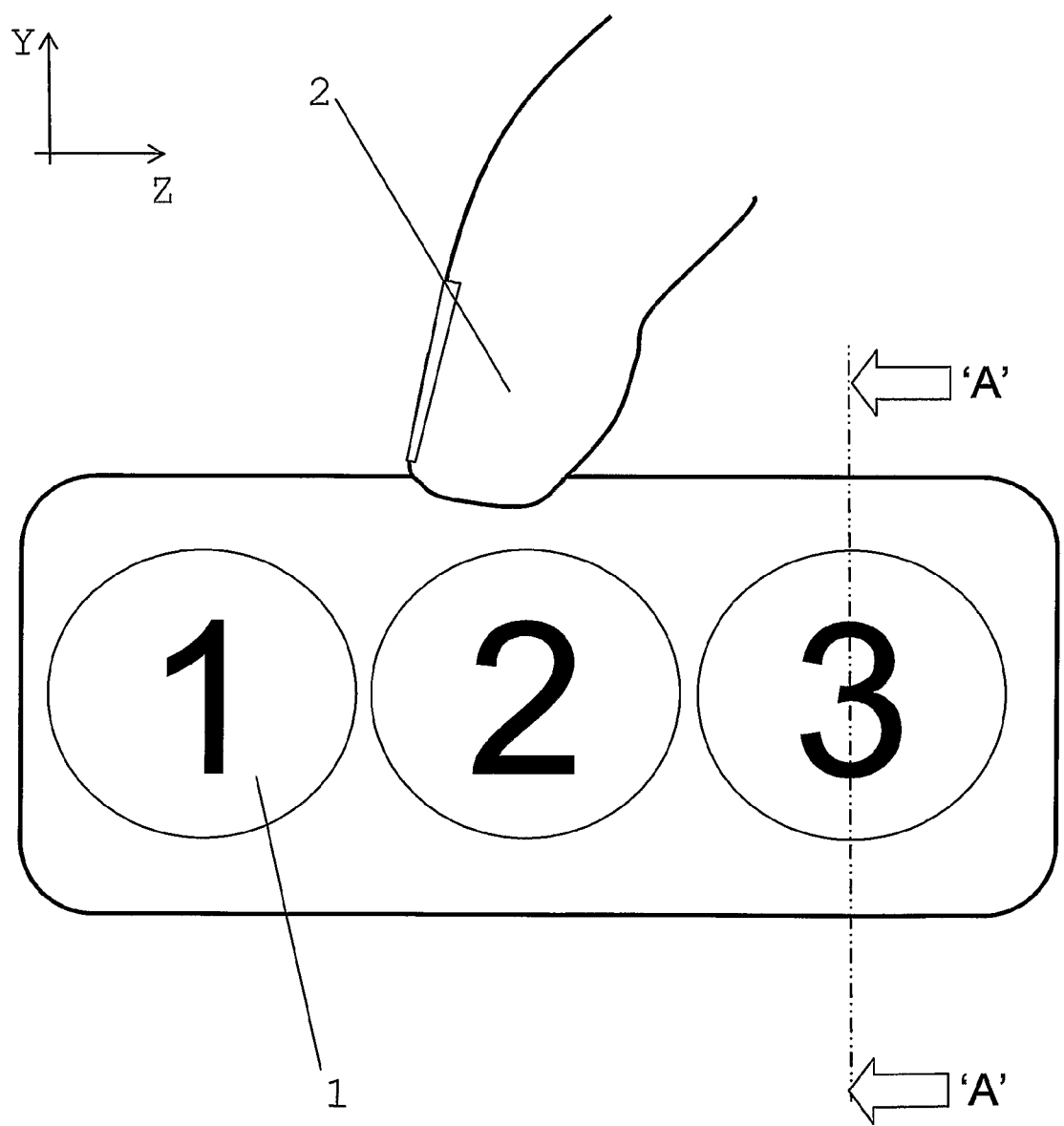
FIG. 1 shows a plan view of a push button keypad according to an embodiment of the invention.

FIG. 1 shows a plan view of a device according to a first embodiment of the invention, in the form of a user interface comprising a push button keypad. A substantially impermeable, robust, protective fascia panel 1 made from stainless steel is printed (or etched) with user graphics. The panel 1 protects the keypad's interior from the environment for reasons of safety, hygiene and reliability. A user presses on the panel 1 with his finger 2. The panel 1 deforms elastically by a small amount when pushed by the user and returns to its original state afterwards. The detector is located behind the push button but is not shown for clarity. The panel 1 can be made from a range of materials which are preferably durable and strong but with some elastic properties. Examples of preferred materials are steel, Acrylonitrile Butadiene Styrene (ABS) mouldings, copper, aluminium, wood, glass fibre, printed circuit board PCB substrates etc. Advantageously, conductive materials also shield against electromagnetic emissions. Preferably, the materials have a Young's Modulus of less than 270 GPa (measured at room temperature). Preferably, very hard materials such as ceramic, diamond, tungsten carbide are not used because the deformation caused by a user would be very small.

Figure 2:
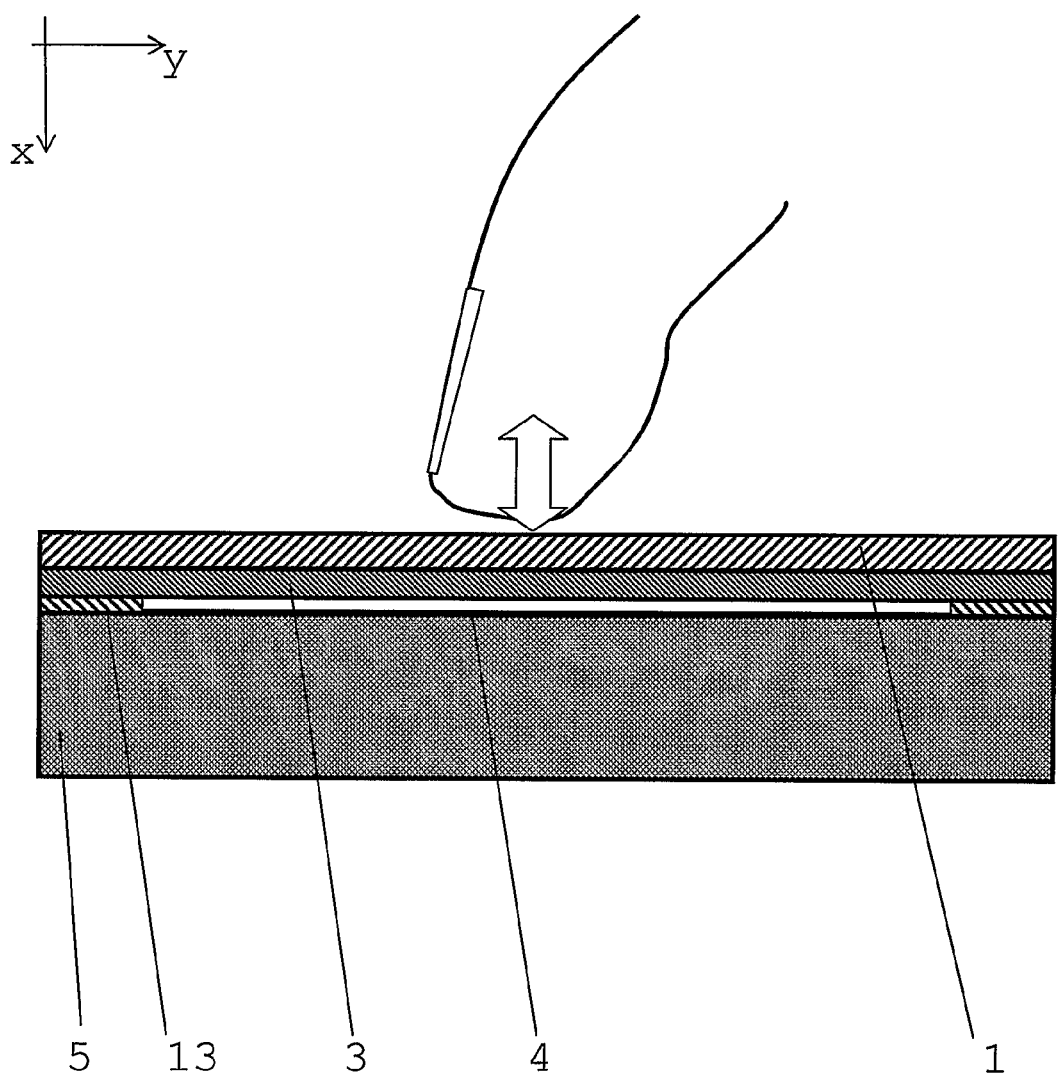
FIG. 2 is a cross-sectional view of the embodiment of FIG. 1 along line A-A.

FIG. 2 shows a section along line A-A of FIG. 1 in which a laminar conductive target 3 such as an electroplated copper disk is attached to the underside of the panel 1. Preferably, the target 3 is a highly conductive material such as copper or aluminium. Deformation of the panel 1 causes some of the target 3 to move towards the AC energized inductor 4 and so alter its inductance. In this example the deformation causes movement towards the inductor 4 but in other arrangements deformation could cause movement away. The inductance value of the inductor 4 therefore changes according to deformation. The inductor 4 is formed as a spiral track on the upper layer of a 2-layer printed circuit board (PCB) 5. The PCB substrate 5 carries the inductor 4 tracks and acts as a mechanical barrier to prevent large, plastic deformation or damage. This barrier may be strengthened by using thick, sturdy PCB 5, additional mechanical restraints or back filling with epoxy, expanded foam etc. Such constructions are advantageous in instances where the detector must withstand impact. Shorting of the inductor tracks 4 caused by gross deformation of the target 3 can be prevented by a thin layer of insulation over the inductor 4. The spacer 13 is a sheet with holes to allow deformation. The spacer helps mechanically isolate each push button from its neighbours so that misreads are avoided.

Figure 3:
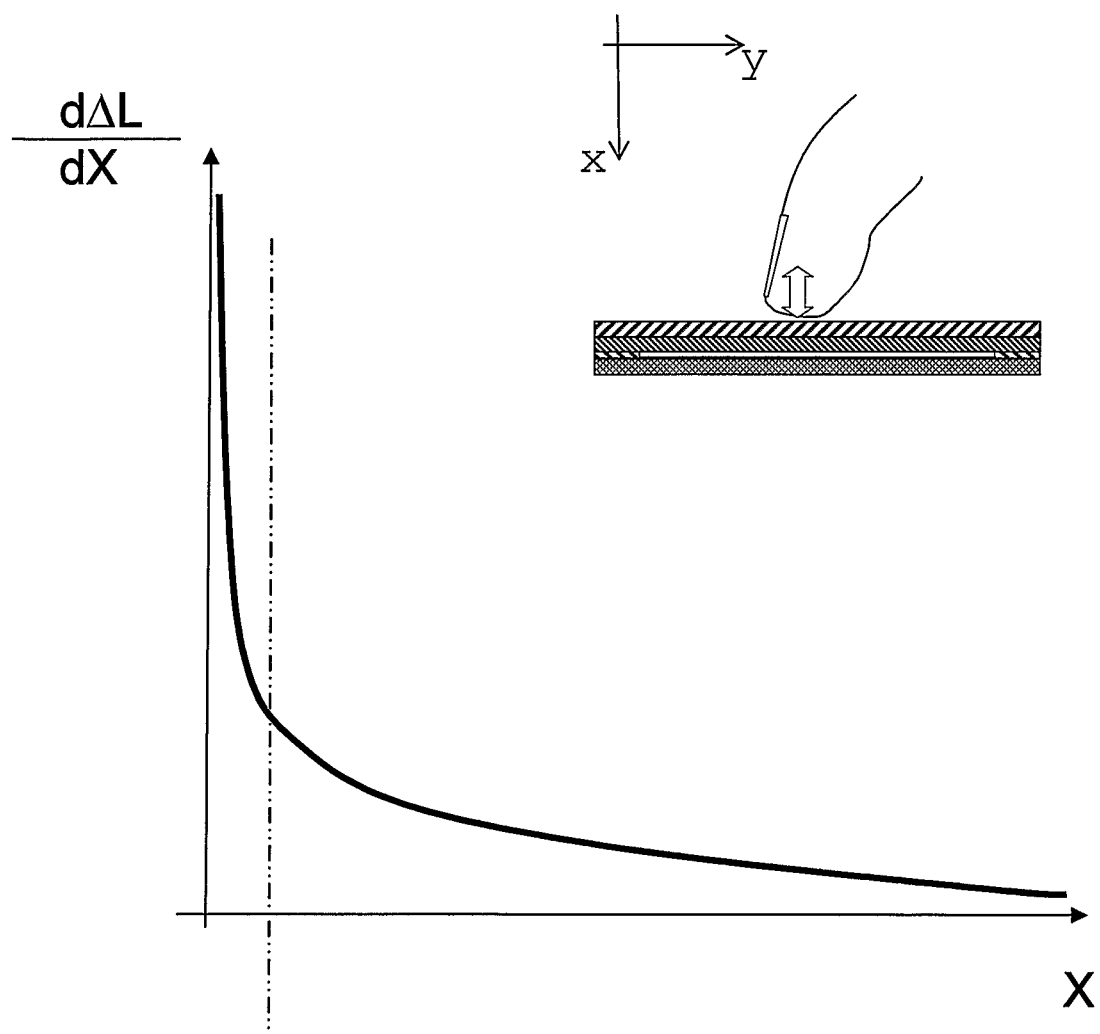
FIG. 3 shows a graph of the rate of change of inductance per unit of distance in the measurement x axis versus position along the measurement axis.

FIG. 3 shows the inductor's rate of change of inductance with respect to distance moved by a target 3 in the x-axis ($d\Delta L/dX$) versus position of the target 3 along the x-axis (X). Note the greater rate of change or sensitivity close to the inductor 4. Traditional inductive detector arrangements often aim to maximize the measurement range and miss the opportunity presented by the sensitivity very close to the inductor's windings 4. This is important in detecting very small deformations caused by light finger pressure on a stiff panel 1. For a separation distance of 1 unit, the overlapping area of the target 3 and inductor 4 should be at least 150 units$^2$ and preferably >1000 units$^2$. The exact choice of separation distance depends upon the application's aesthetics, size, panel material etc, but the smaller the separation between the inductive parts of a given size, the greater the detector's sensitivity. Note that the arrangements in FIGS. 1 & 2 measure deformation not displacement since the same signal is produced from either substantially deforming a small portion of the target 3 or from slightly deforming a large portion of the target 3. In applications where the deformation is very small it is preferable that the detector is arranged with the inductor 4 and target 3 separated by a very thin insulating film, such as a varnish coat, and the deformation causes greater separation. Such an arrangement ensures the detector works in the most sensitive part of its range.

Figure 4:
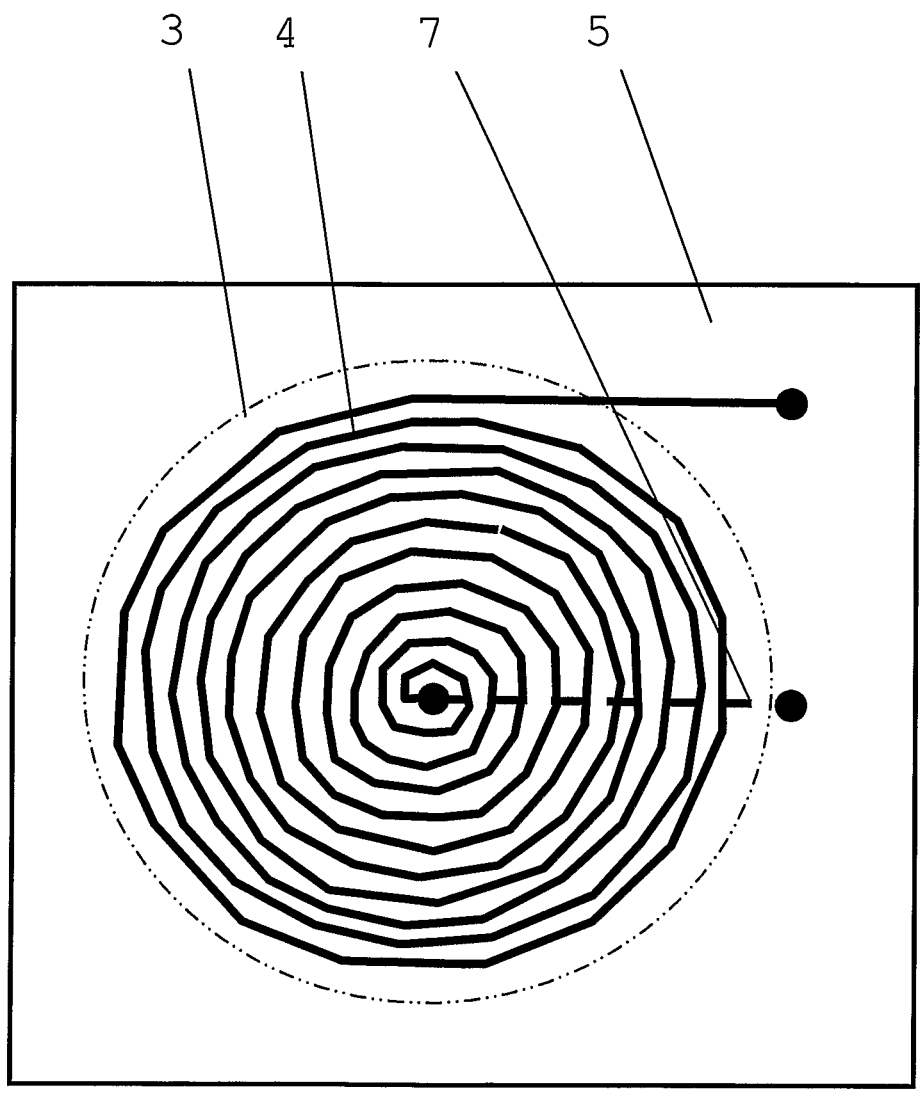
FIG. 4 shows a plan view of an inductor on a printed circuit board.

FIG. 4 shows a plan view of an inductor 4 on a 2-layer PCB co-operating with a target 3 (shown in outline) above it. The inductor 4 is formed as a spiral winding substantially on one PCB layer 5. The inductor circuit 4 is completed by taking the innermost track out using a plated via hole and a link 7. In this embodiment the link 7 is formed by a conductive track on the underside of the board.

The inventors found that an arrangement based on the following works well: 0.3 mm thick stainless steel panel 1; push buttons spaced at a 25 mm pitch; planar spiral wound inductors 4 of 23 mm outer diameter with 0.25 mm track and gap width substantially on one side of FR4 grade PCB substrate 5 0.8 mm thick; an FR4 grade PCB spacer 13 0.25 mm thick and a target 3 as an etched copper disk of 23 mm diameter.

Figure 5:
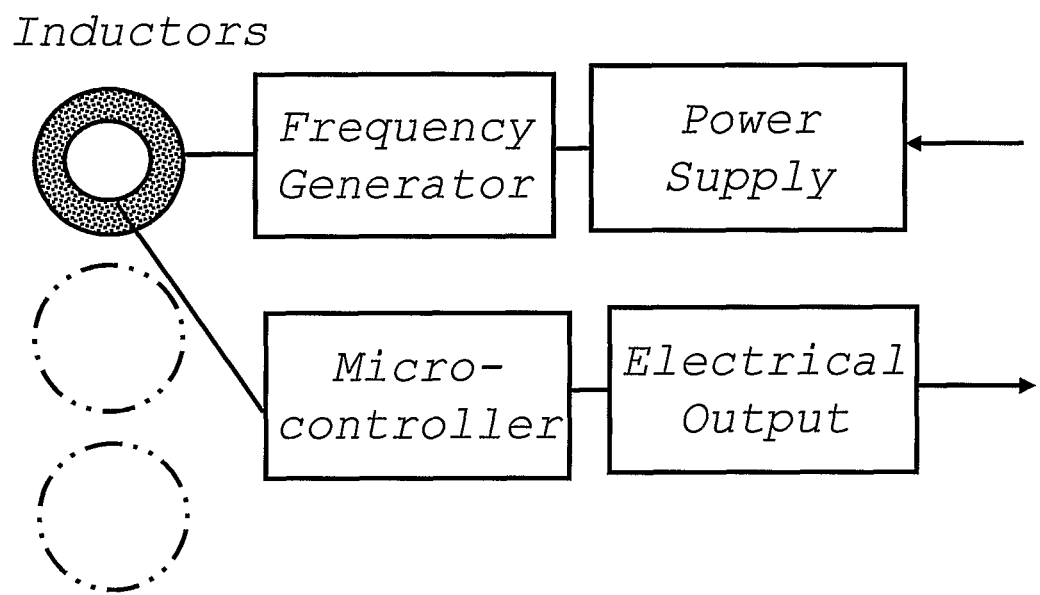
FIG. 5 shows a schematic view of an electronic circuit according to an embodiment of the invention.

FIG. 5 shows a simplified electronic circuit schematic. The circuit includes a power supply, frequency generator, inductors 4, microprocessor and an electrical output. The power supply is typically 5 VDC, 10 milliamps for 100% duty cycle. The frequency generator comprises an oscillator to generate signals from 100 kHz to 10 MHz, but preferably 1 to 5 MHz. There are various techniques which can measure inductance including an inductance bridge, current measurement or tank circuit frequency shift. Preferably, to provide measurement stability, the inductance value is compared to another inductor so that a change in inductance ratio is measured. The reference inductor may be the inductor 4 of one or more of the other push buttons. The microcontroller preferably has a flash memory with analogue inputs and is programmed to suit the application. Some additional analogue electronics, for example, an amplifier and filter may be required but these are not shown for clarity. The microcontroller may be dedicated to the detector system but may also carry out other functions such as display or motor control. FIG. 3 shows an electrical output to the host system. Preferably, a serial data stream is used but an analogue output such as 0 to 5V or 4 to 20 mA could be used. The electronic circuit may be augmented with a speaker to provide feedback when input is sensed. Audio feedback helps compensate for the lack of tactile feedback but has the advantage of being programmable to a desired tone, volume etc.

The electronics circuit will often control multiple inputs. This may be achieved by adding one or more multiplexers which can simply step through each detector in turn or use more sophisticated algorithms based on most frequently or most recently used detectors.

Figure 6:
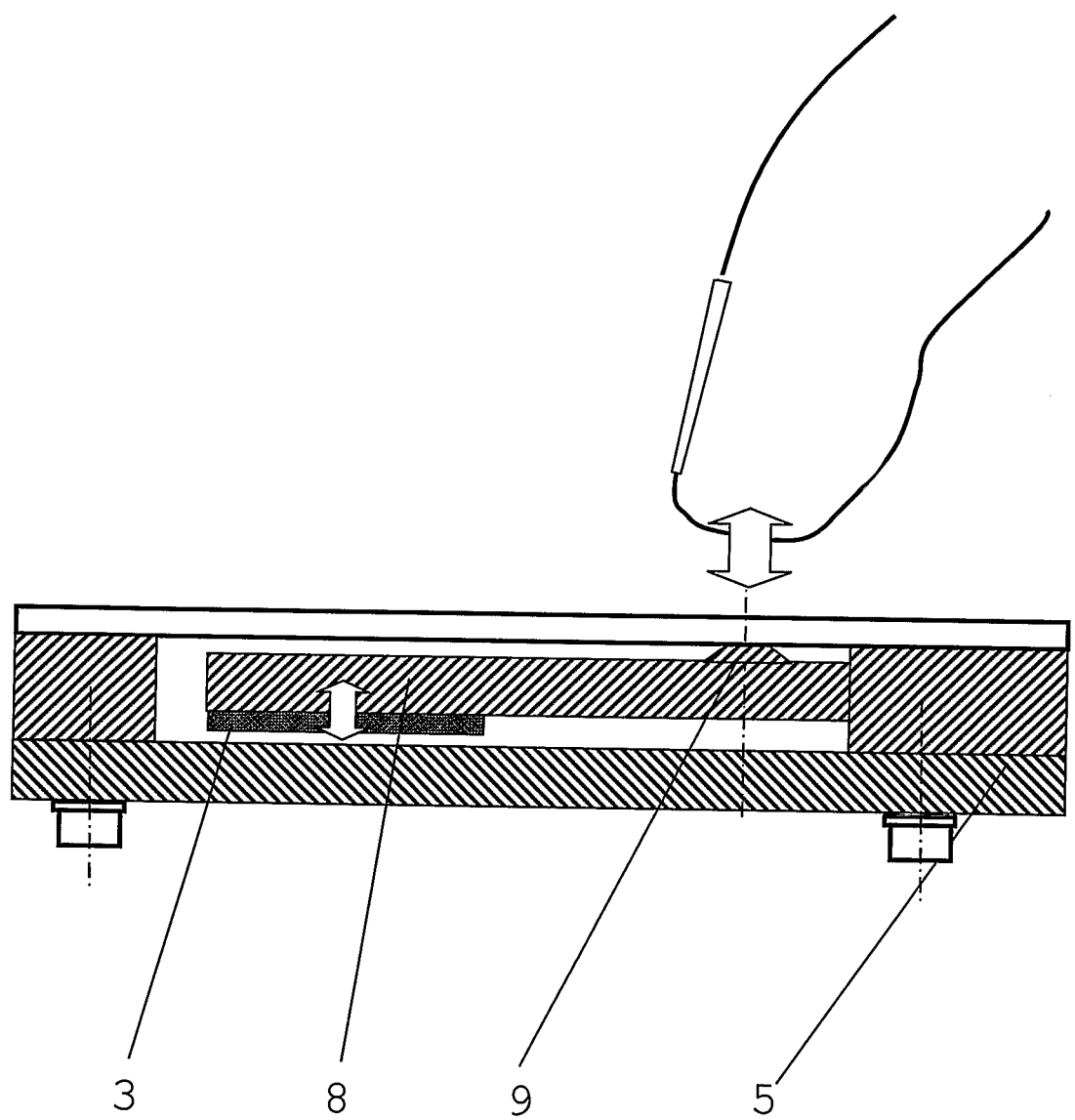
FIG. 6 shows a sectional view of a variation of embodiment of FIG. 1 used with a stiff panel.

In some applications a stiff resilient panel may be required. In such applications the deformation caused by user interaction is small. These small deformations may be amplified by various mechanical means. FIG. 6 shows a sectional view of an arrangement used to amplify the small deformations in a stiff panel 1 using a lever 8. The lever 8 is preferably made from a cantilever or tongue of PCB material which touches the rear face of the panel 1. A target 3 such as a copper disk is attached to the lever 8. The lever 8 extends from behind the push button area. A bump 9 on the cantilever touches the back of the panel 1 where the user is most likely to touch. Other mechanical means include, for example, a disk which forms a dish shape when it is pressed close to its middle.

Production of the target 3 by electroplating is advantageous since such techniques can be cost effectively combined with electro-etching to produce mechanical ridges, columns or furrows on the top or bottom side of the panel 1. Such patterns can be used to optimize the deformation produced by a given finger pressure whilst still leaving areas of thicker material (to prevent mechanical damage) when the panel is pressed hard. Such mechanical patterns may also be made by plastic injection moulding or machining methods.

Figure 7:
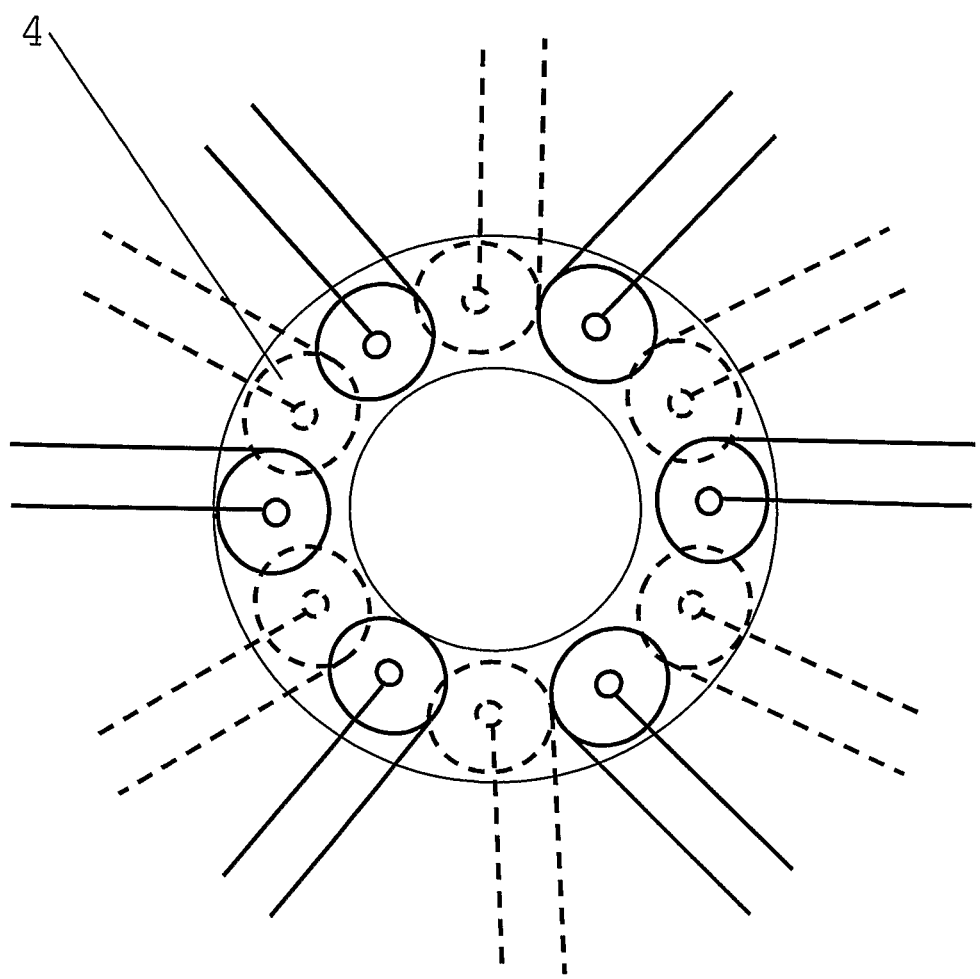
FIG. 7 shows a plan view of an annular embodiment of the invention.

FIG. 7 shows detectors arranged in an annulus according to a second embodiment of the invention in the form of an extended touch detector where the user might apply force at a point along a straight line, curved line or circle. Such annular arrangements have been used in portable music players. Maximum deformation occurs where the user applies force along the circle. The deformation may extend over several detectors. Comparison of the readings from each of the detectors can be used to calculate the position of the applied force. In such constructions it is advantageous to break a continuous target 3 into several individual targets 3 to provide greater differentiation between neighbouring detectors.

An alternative embodiment of the invention is a joystick. A joystick is attached to the panel 1 so that the user's interaction with the joystick (including upward motion) causes deformation of the panel. The interaction can be sensed by comparing the readings from multiple detectors arranged at various points on the panel.

A further embodiment of the invention is a touch screen with detectors arranged around its edges. Inputs from multiple detectors are used to determine user input on the screen. For example, four detectors may be located under each corner of a screen held in a resilient bezel. The position of a finger at various points of the screen can be calculated by comparing the readings of the four detectors. This may be carried out initially using a teach mode and then capturing the data in electronic memory as a look up table.

Figure 8:
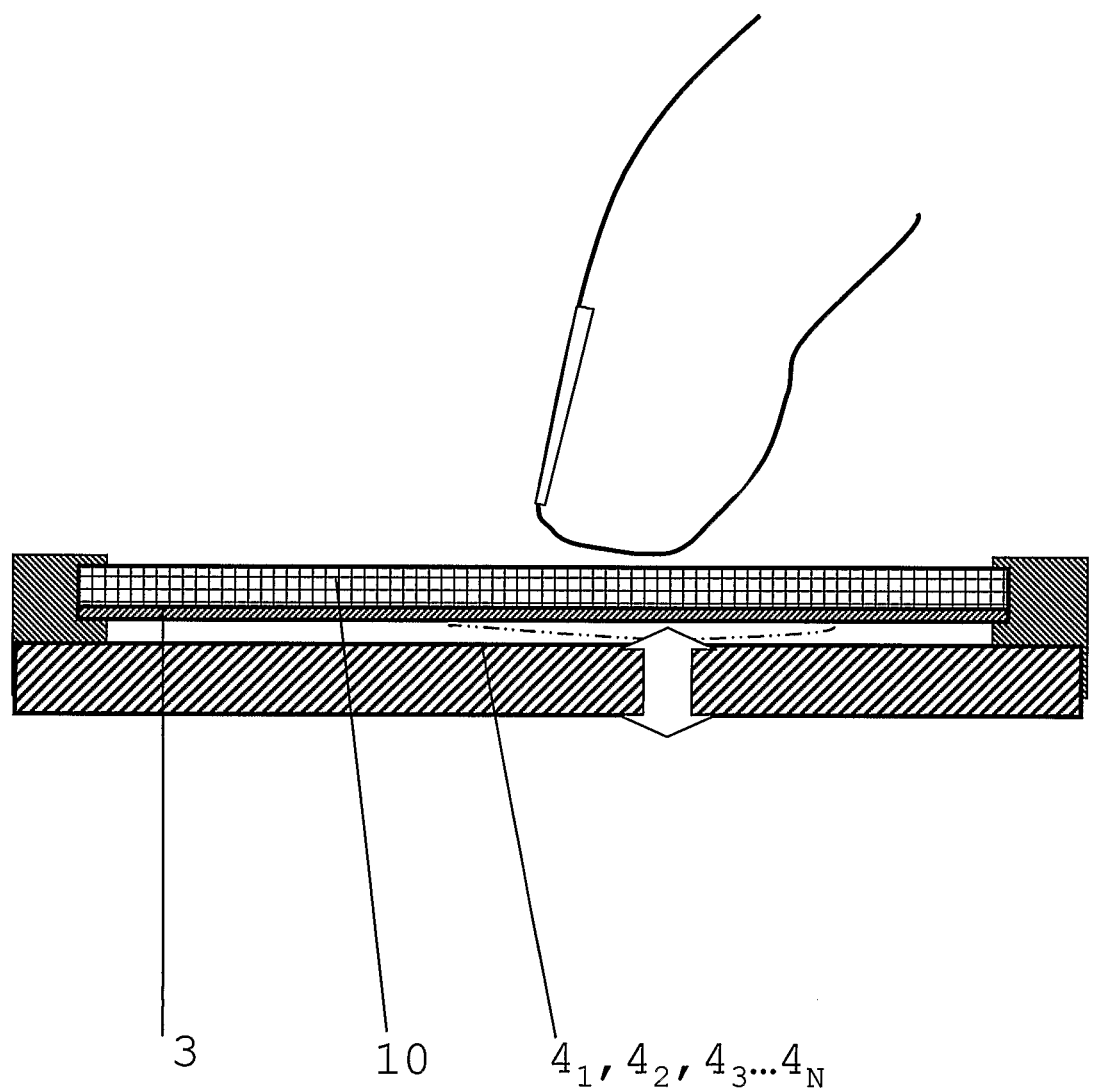
FIG. 8 shows a sectional view of a touch screen embodiment of the invention.

FIG. 8 shows a sectional view of a yet further embodiment of the invention in the form of a touch screen or pad. The user causes deformation of a laminar target 3 behind a display 10 and the position of the user's input is detected by comparing the readings from a 2-dimensional pattern of detectors. The detectors may be arranged on multiple layers of the circuit board and overlap. The target 3 may be a continuous sheet or a multiplicity of targets 3 in a 2-D pattern. Advantageously, the performance of the detectors is substantially independent of the chemical composition of the screen and what is going on electrically on the screen. This is advantageous with organic light emitting and plastic electronic type displays since both the display and detector array can be produced by printing.

Figure 9:
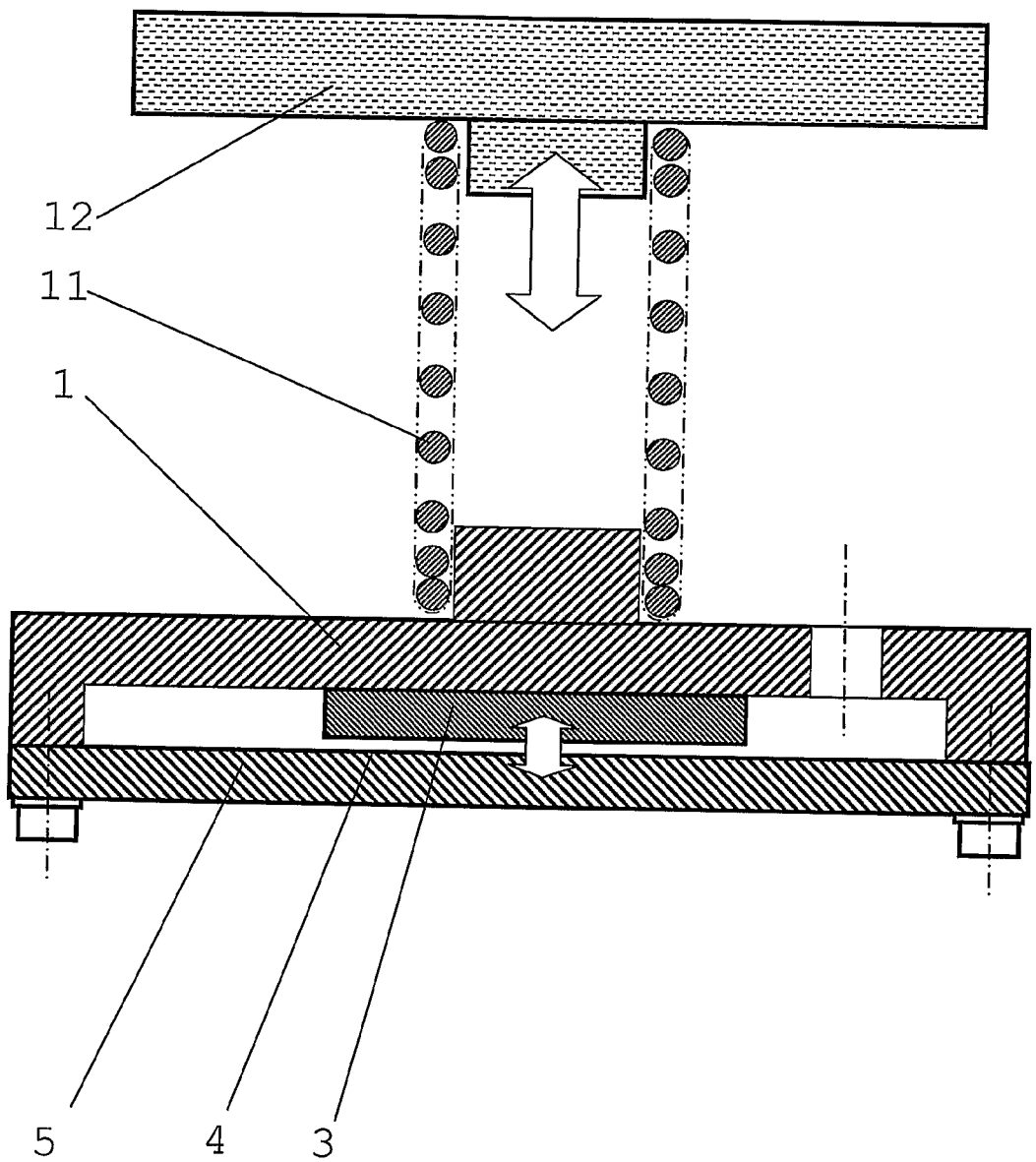
FIG. 9 shows a sectional view of an embodiment of the invention co-operating with a spring.

An embodiment of the invention can be used to measure displacement over a larger distance by arranging a spring 11 between the panel 1 and a body 12 moving by a large distance. FIG. 9 shows a sectional view of such an arrangement. As the body 12 displaces closer to the panel 1, deformation will be large as the spring tightly compresses and vice versa. The spring 11 may be arranged so that when it is far away it will pull the panel rather than push. Such arrangements are useful to measure the displacement of pistons in cylinders, shock absorbers and air or fluid dampers.

There are various arrangements of inductive elements which may be used for the inductive detector using various permutations and combinations of coils, windings, targets, electrical intermediates, resonant targets etc. For example, the target 3 described so far could be replaced by a shorted passive circuit or an AC energized winding. Arrangements may operate using changes in mutual inductance or self inductance relative to deformation.

So far embodiments have been described in which the deformation is into a gas cavity at atmospheric pressure. Alternatively, the cavity may be filled by a pressurised gas, liquid or highly elastic material such as rubber. These fillings can be used to prevent gross deformation and provide a restorative force after deformation. Elastic sheets are particularly useful in 2D arrangements.

Electrical connections to the detector can be carried across a transformer coupling. Such arrangements allow the detector to be placed on a body which moves relative to the electronics controls. Such an arrangement might be used, for example, to measure the force applied by a rider to each pedal of a bicycle for training purposes. The electronic controls are positioned on the bicycle frame; the detectors are arranged to measure the force or torque applied to each pedal by the rider and the electrical supply is carried across a transformer link at the pedal crank.

The PCB 5 containing the inductance 4 may also carry other electronic elements such as light emitting diodes (LED's) or displays. The invention has particular utility with printed electroluminescent (EL) inks co-operating with conductive inks. The invention has particular utility with EL devices which would traditionally utilise membrane switches.

In arrangements with multiple detectors, each detector need not be individually connected. Instead, where inductance changes are sufficiently large, inductance change across the rows and columns of an array of detectors may be used.

In systems using multiple detectors, the effects of vibration or electrical noise may be negated by the use of common mode rejection algorithms contained in software. In such algorithms, readings which are common to multiple detectors are ignored and only those readings from detectors which differ to the others are signalled.

In a push button 1 the characteristics of a single user input may be taught e.g. time to press down, time to return etc. The characteristics of a person keeping a finger in place can also be taught. Further, the amount of force may also be input to the host system to increase or decrease the rate at which a control parameter is altered.

When the deformation is highly localised it may be that only a small part of the target 3 deforms towards the inductor 4. In such instances, it is preferable to avoid the resulting low signals by a mechanical arrangement that will cause all of the target 3 to move relative to the inductor 4. For example, in FIG. 2 the target 3 could be centrally pinned in place rather than being attached across its full area. Consequently, any deformation would cause the entire target 3 to displace.

The inductor 4 may be produced with a centre tapping point so that measurements can be taken across the whole inductor or just the inner or outer portions of the inductor. Such inner or outer portions can be used as the reference inductor for ratiometric measurements.

Although a user's finger 2 has been used in earlier embodiments, a stylus, pen, key or other implement could also cause deformation. The user might also apply a force using any part of his body.

Preferably, the electronics circuit is located close to the inductors 4 to avoid any electromagnetic compatibility (EMC) problems. If the circuit is more than a few centimeters distant, then a small loop area arrangement of conductors between the circuit and the detector should be used to avoid EMC problems. This can be achieved using twisted pair cable; arranging tracks on various layers of the PCB 5 or locating tracks on the inner layers of the PCB 5 whose outer layers are copper planes.

Although preferred panel materials should not be too stiff it has been found that fairly stiff materials such as glass can be used as long as they are used as thin laminates. For example, 0.3 mm glass works well with 25 mm pitch keys. To produce greater deformation, the panel 1 need not be attached on all its sides.

In some arrangements, a separate conductive element 3 is not needed if the panel 1 is sufficiently conductive that it can act as a combined panel 1 and target 3. Copper or silver are particularly advantageous in applications where hygiene is important since user interface panels 1 made with these materials have superior anti-bacterial or anti-microbial properties.

Inductors 4 can be constructed in various ways including windings on multiple layers of a PCB; pancake style windings; printed conductive ink; single layer PCB with insulated jumpers taking the innermost winding to the outside etc.

The detector can be arranged to measure rotary position by measuring the deformation caused by a threaded part as it rotates in a threaded housing.

The detector can be arranged as a combined detector and switch when the deformation also causes electrical contacts to open or close. Such contacts can be combined with the detector's laminar winding and may, for example, signal maximum deflection.

Measuring the resistance of the inductors may be used to measure temperature.

The detector may also be used to measure a range of parameters including pressure, weight, vibration, flow etc. The detector has particular utility in flow measurement since the target 3 can be arranged as a membrane with fluid on both sides to allow accurate measurement of small differential pressures and hence flow. Applications for the invention include but are not limited to push buttons, rocker buttons, position sensors, touch sensors, pinch sensors, impact sensors, 1-dimensional user inputs, 2-dimensional user inputs, multi-dimensional user inputs, accelerometers, joysticks, infant/cot monitors, touch screens, touch pads, linear displacement sensors, rotary displacement sensors, weight sensors, strain sensors, vibration sensors, level sensors, impact sensors, actuator sensors, pressure sensors, differential pressure sensors, proximity sensors, torque sensors and flow sensors.

In summary, an apparatus for user interfaces to measure inductively the deformation of a body 1 comprises at least two laminar conductive elements 3, 4, at least one of which is an AC energized inductor 4, wherein deformation causes relative axial movement between the at least two laminar elements 3, 4 and the maximum deformation distance is limited to prevent damage.

The invention claimed is:

1. A pressure-sensitive detector of user input on a user interface comprising:
   a first generally laminar inductive component;
   a second generally laminar inductive component; and
   a resilient panel,
   wherein the first inductive component and the second inductive component are arranged in facing relation and are mutually spaced;
   wherein the resilient panel deforms under the pressure of a user and is arranged for flexural movement relative to the second inductive component and the first inductive component is arranged for movement with the resilient panel,
   whereby, in use, pressure applied to the resilient panel causes movement of the first inductive component relative to the second inductive component, and a consequent change in the inductive coupling between the first and second inductive components;
   said detector further comprising at least one electronic detection circuit for detecting said change in the inductive coupling; said change being indicative of the pressure applied by the user on said user interface,
   wherein the resilient panel has a stiffness of at least 500 N/m and the ratio of the mutually overlapping area of the first and second inductive components to the square of the spacing of the first and second inductive components is greater than 150 to 1,
   wherein one of the first and second inductive components comprises a plurality of spiral windings wound around respective points; said spiral windings being in the plane of said laminar inductive component and wound around respective axes orthogonal to the plane of said laminar inductive component; and
   said detector further comprises a spacer sheet for spacing said first inductive component from said second inductive component; said spacer sheet comprising a plurality of apertures which define a plurality of sensitive regions of the detector; said apertures each comprising only one of said at least one spiral winding wound around a point; the spacer sheet supporting said resilient layer outside of said aperture to isolate mechanically said sensitive regions of the detector,
   wherein said other one of said first and second inductive components is a passive continuous component which deforms into said apertures solely when a user applies pressure onto said user interface and returns resiliently to its original state after pressure has been applied, and
   wherein said detector comprises a reference inductor, whereby a measured inductance value of a spiral winding is compared to an inductance value of said reference inductor in order to measure a change in inductance ratio.

2. A detector as claimed in claim 1, wherein one of the first and second inductive components is a bulk conductor and the other of the inductive components comprises said spiral winding wound around a point; said winding passing through a via to take the winding's track from said point to the outside of said winding.

3. A pressure-sensitive detector of a user input on a user interface comprising:
   a first generally laminar inductive component;
   a second generally laminar inductive component; and
   a resilient panel,
   wherein the first inductive component and the second inductive component are arranged in facing relation and are mutually spaced;
   wherein the resilient panel deforms under the pressure of a user and is arranged for flexural movement relative to the second inductive component and the first inductive component is arranged for movement with the resilient panel,
   whereby, in use, pressure applied to the resilient panel causes movement of the first inductive component relative to the second inductive component, and a consequent change in inductance of at least one of the first and second inductive components,
   said detector further comprising at least one electronic detection circuit for detecting said change in the inductive coupling; said change being indicative of the pressure applied by the user on said user interface,
   wherein one of the first and second inductive components is a bulk conductor and the other of the inductive components comprises a plurality of spiral windings wound around respective points; said spiral windings being in the plane of said laminar inductive component and wound around respective axes orthogonal to the plane of said laminar inductive component; and
   said detector further comprises a spacer sheet for spacing said first inductive component from said second inductive component; said spacer sheet comprising a plurality of apertures which define a plurality of sensitive regions of the detector; said apertures each comprising only one of said at least one spiral winding wound around a point; the spacer sheet supporting said resilient layer outside of said aperture to isolate mechanically said sensitive regions of the detector,
   wherein said other one of said first and second inductive components is a passive continuous component which deforms into said apertures solely when a user applies pressure onto said user interface and returns resiliently to its original state after pressure has been applied, and
   wherein said detector comprises a reference inductor; whereby a measured inductance value of a spiral winding is compared to an inductance value of said reference inductor in order to measure a change in inductance ratio.

4. A detector as claimed in claim 3, wherein the first inductive component is a bulk conductor and the second inductive component comprises said spiral winding wound around a point; said winding passing through a via to take the winding's track from said point to the outside of said winding.

5. A detector as claimed in claim 4, wherein the first inductive component is formed by the resilient panel.

6. A detector as claimed in claim 3, wherein the first inductive component is mounted to the resilient panel.

7. A detector as claimed in claim 3, wherein the second inductive component is formed as a layer deposited on a substrate.

8. A detector as claimed in claim 7, wherein the resilient panel is mounted to the substrate.

9. A touch sensitive input device comprising a detector as claimed in claim 3.

10. An input device as claimed in claim 9, comprising a plurality of detectors, the detectors having a common resilient panel.

11. An input device as claimed in claim 9, comprising a display device mounted to a surface of the resilient panel remote from the second inductive component.

12. A detector according to claim 1, wherein said spacer sheet is located between said first and said second inductive components for electrically insulating said first inductive component from said second inductive component.

13. A detector according to claim 3, wherein said spacer sheet is located between said first and said second inductive components for electrically insulating said first inductive component from said second inductive component.

14. A detector according to claim 1, wherein said spacer sheet incorporates a plurality of apertures defining sensitive regions and said resilient panel is common to a plurality of sensitive regions; said panel being unsupported by the spacer sheet in the apertures.

15. A detector according to claim 3, wherein said spacer sheet incorporates a plurality of apertures defining sensitive regions and said resilient panel is common to a plurality of sensitive regions; said panel being unsupported by the spacer sheet in the apertures.

\* \* \* \* \*